US011257686B2

(12) United States Patent
Tanaka (10) Patent No.: US 11,257,686 B2
(45) Date of Patent: Feb. 22, 2022

(54) LASER ANNEALING APPARATUS AND SHEET RESISTANCE CALCULATION APPARATUS

(71) Applicant: SUMITOMO HEAVY INDUSTRIES, LTD., Tokyo (JP)

(72) Inventor: Teppei Tanaka, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 177 days.

(21) Appl. No.: 16/116,066

(22) Filed: Aug. 29, 2018

(65) Prior Publication Data

US 2019/0074192 A1   Mar. 7, 2019

(30) Foreign Application Priority Data

Sep. 5, 2017   (JP) .............................. JP2017-170504

(51) Int. Cl.
| G01N 21/88 | (2006.01) |
| G01N 21/00 | (2006.01) |
| G01B 15/02 | (2006.01) |
| G01N 21/95 | (2006.01) |
| G01B 9/02 | (2006.01) |
| H01L 21/324 | (2006.01) |

(Continued)

(52) U.S. Cl.
CPC ........ *H01L 21/324* (2013.01); *G01R 31/2831* (2013.01); *H01L 22/14* (2013.01); *G01J 5/20* (2013.01); *H01L 21/268* (2013.01); *H01L 22/20* (2013.01)

(58) Field of Classification Search
CPC ............ G01N 21/1717; G01N 27/041; G01R 31/2831
See application file for complete search history.

(56) References Cited

U.S. PATENT DOCUMENTS 5,781,018 A * 7/1998 Davidov ............ G01R 1/06772
                                                    324/637
8,415,961 B1    4/2013 Zhao et al.
(Continued)

FOREIGN PATENT DOCUMENTS

| JP | 2007-081348 A | 3/2007 |
| JP | 2016-219584 A | 12/2016 |
| JP | 2017-022332 A | 1/2017 |

OTHER PUBLICATIONS

Isenberg et al. ("Fast, Contactless and Spatially Resolved Measurement of Sheet Resistance by an Infrared Method", Progress in Photovoltaics: Research and Applications 2004; 12:539-552) (Year: 2004).*

(Continued)

*Primary Examiner* — Brian Turner
(74) *Attorney, Agent, or Firm* — Michael Best & Friedrich LLP (57) ABSTRACT

A laser beam from a laser optical system is incident onto a semiconductor wafer. Thermal radiation light from the semiconductor wafer is incident onto an infrared detector. The infrared detector outputs a signal based on the intensity of the thermal radiation light. A processing device calculates a sheet resistance of the semiconductor wafer that is annealed by the laser beam on the basis of an output value of the infrared detector, and outputs a calculation value of the sheet resistance to an output device.

8 Claims, 5 Drawing Sheets

(51) Int. Cl.
  *H01L 21/66* (2006.01)
  *G01R 31/28* (2006.01)
  *G01J 5/20* (2006.01)
  *H01L 21/268* (2006.01)

(56) References Cited

U.S. PATENT DOCUMENTS

| | | | | |
|---|---|---|---|---|
| 2003/0085730 A1* | 5/2003 | Borden | ............. | G01N 21/1717 324/754.23 |
| 2003/0150993 A1* | 8/2003 | Nicolaides | ........... | G01N 21/171 250/339.11 |
| 2003/0164946 A1* | 9/2003 | Borden | ............. | G01N 21/1717 356/432 |
| 2004/0183019 A1* | 9/2004 | Mandelis | ................ | G01N 21/17 250/341.1 |
| 2004/0253752 A1* | 12/2004 | Su | ......................... | G01N 27/041 438/17 |
| 2005/0062971 A1* | 3/2005 | Salnik | ................ | G01N 21/1717 356/432 |
| 2005/0134857 A1* | 6/2005 | Maury | ............... | G01N 21/1717 356/432 |
| 2005/0200850 A1* | 9/2005 | Borden | ............. | G01N 21/1717 356/432 |
| 2007/0188761 A1* | 8/2007 | Salnik | ................ | G01N 21/1717 356/432 |
| 2008/0151247 A1* | 6/2008 | Salnik | ................ | G01N 21/1717 356/432 |
| 2012/0133922 A1* | 5/2012 | Pfaff | .................... | G01R 31/311 356/51 |
| 2013/0043393 A1* | 2/2013 | Heaven | .............. | G01N 21/3563 250/341.4 |
| 2013/0278749 A1* | 10/2013 | Mandelis | ................. | H04N 5/33 348/87 |
| 2016/0195479 A1* | 7/2016 | Pfaff | .................... | G01B 11/164 356/458 |
| 2016/0282284 A1 | 9/2016 | Hayashi et al. | | |
| 2016/0305995 A1* | 10/2016 | Kim | .................... | G01R 31/309 |

OTHER PUBLICATIONS

Search Report issued in European Patent Application No. 18189849.5, dated Jan. 7, 2019.

\* cited by examiner

EMBODIMENT

FIG. 5B

FOUR-POINT PROBE METHOD

FIG. 5C

EMBODIMENT + FOUR-POINT PROBE METHOD

LASER ANNEALING APPARATUS AND SHEET RESISTANCE CALCULATION APPARATUS

RELATED APPLICATIONS

Priority is claimed to Japanese Patent Application No. 2017-170504, filed Sep. 5, 2017, the entire content of which is incorporated herein by reference.

BACKGROUND

Technical Field

Certain embodiments of the present invention relate to a laser annealing apparatus and a sheet resistance calculation apparatus.

Description of Related Art

In the related art, as an example of a method for recognizing an in-plane distribution of an activation state of a semiconductor wafer that is subjected to implantation of dopants and activation annealing, measurement of a sheet resistance is performed. The activation state of the dopants may be evaluated from the in-plane distribution of the sheet resistance.

SUMMARY

According to an embodiment of the present invention, there is provided a laser annealing apparatus including: a laser optical system that causes a laser beam to be incident onto a semiconductor wafer; an infrared detector onto which thermal radiation light from the semiconductor wafer is incident, and which outputs a signal based on the intensity of the thermal radiation light; and a processing device that calculates a sheet resistance of the semiconductor wafer that is annealed by the laser beam on the basis of an output value of the infrared detector and outputs a calculation value of the sheet resistance to an output device.

According to another embodiment of the present invention, there is provided a sheet resistance calculation apparatus including: an infrared detector onto which thermal radiation light from a semiconductor wafer that is an annealing target is incident, and which outputs a signal based on the intensity of the thermal radiation light; and a processing device to which an output value of the infrared detector is input, and which calculates a sheet resistance of the semiconductor wafer on the basis of the input output value and outputs a calculation value of the sheet resistance.

It is possible to measure a sheet resistance of a semiconductor wafer in an in-line manner and in a non-contact manner.

DETAILED DESCRIPTION

Generally, a four-point probe method is used for measurement of a sheet resistance. The measurement of the sheet resistance based on the four-point probe method is performed by a device different from an activation annealing apparatus after annealing. Accordingly, the measurement of the sheet resistance becomes an off-line operation, which takes time and labor. Further, since probes should be in contact with a semiconductor wafer, the semiconductor wafer is damaged.

It is desirable to provide a laser annealing apparatus capable of reducing time and labor for measurement of a sheet resistance and measuring a sheet resistance in a non-contact manner. Further, it is desirable to provide a sheet resistance calculation apparatus capable of calculating a sheet resistance in a non-contact manner.

A laser annealing apparatus according to an embodiment will be described with reference to FIG. 1 to FIG. 5C.

Figure 1:
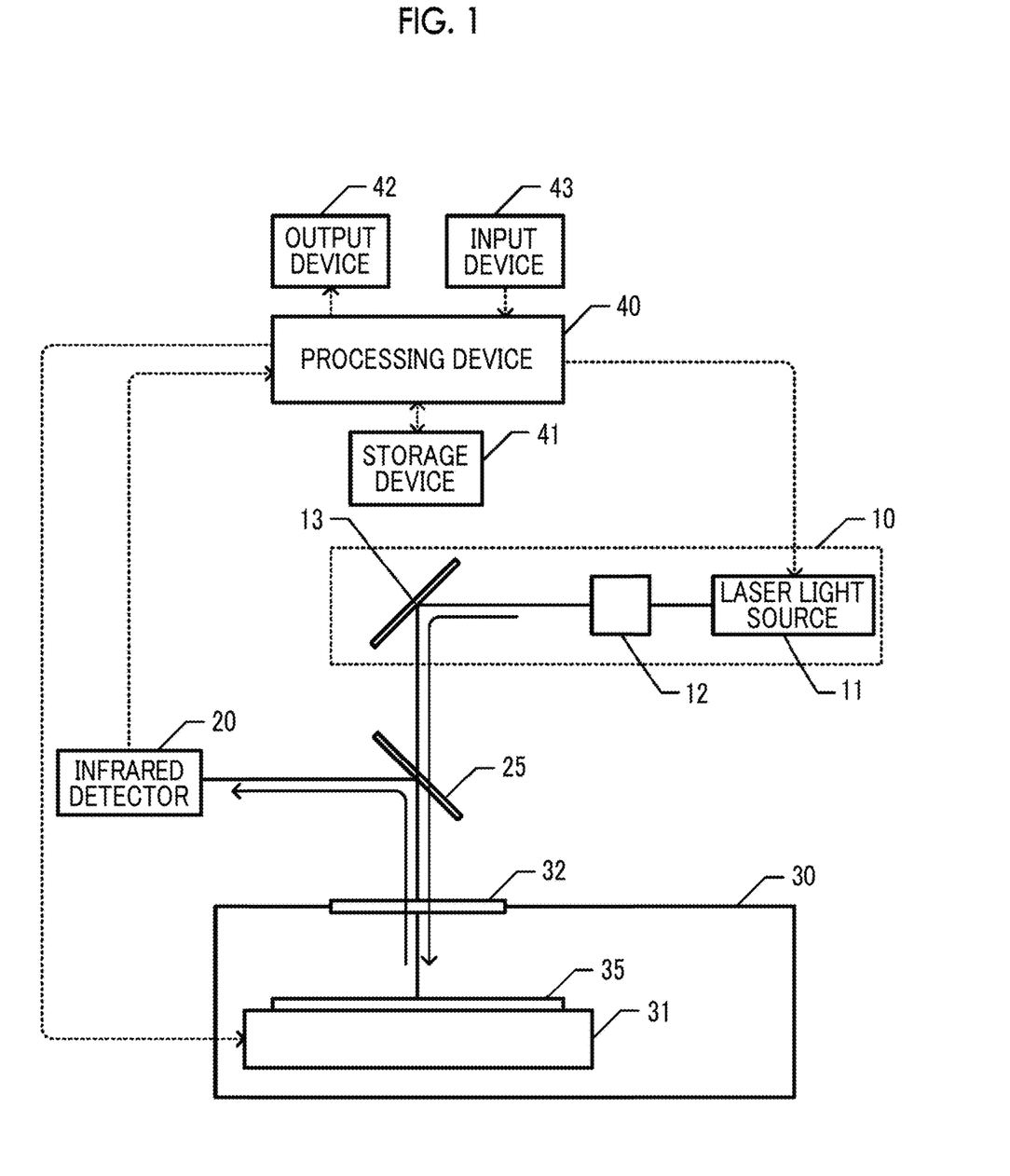
FIG. 1 is a schematic diagram of a laser annealing apparatus according to an embodiment.

FIG. 1 is a schematic diagram of a laser annealing apparatus according to an embodiment. The laser annealing apparatus according to this embodiment includes a laser optical system 10, a chamber 30, an infrared detector 20, a processing device 40, a storage device 41, an output device 42, and an input device 43.

The laser optical system 10 includes a laser light source 11, a uniformizing optical system 12, and a folding mirror 13. The laser light source 11 outputs a laser beam of an infrared region. As the laser light source 11, for example, a laser diode having an oscillation wavelength of 808 nm may be used. The uniformizing optical system 12 makes a beam profile of a laser beam output from the laser light source 11 uniform. The folding mirror 13 reflects a laser beam passed through the uniformizing optical system 12 downward.

A window 32 through which a laser beam passes is provided on a top plate of a chamber 30, and a stage 31 is disposed in the chamber 30. On the stage 31, a semiconductor wafer 35 that is an annealing target is retained. Dopants are implanted into a surface layer part of the semiconductor wafer 35. An ion implantation method is used as the implantation of the dopants, for example. Before annealing, the dopants are not activated. As the semiconductor wafer 35, for example, a silicon wafer may be used. As the dopants, for example, phosphorous (P), arsenic (As), boron (B), or the like may be used.

A laser beam output from the laser optical system 10 passes through a dichroic mirror 25 and the window 32, and is incident onto the semiconductor wafer 35 retained on the stage 31. On a path of the laser beam, a mirror, a lens, or the like may be disposed as necessary. A beam spot of the laser beam on a front surface of the semiconductor wafer 35 has an elongated shape of a length of about 3 to 5 mm and a width of about 0.1 to 0.3 mm, for example. The stage 31 allows movement of the semiconductor wafer 35 in a two-dimensional direction parallel to its front surface. By scanning the surface of the semiconductor wafer 35 in the width direction of the beam spot, it is possible to perform laser annealing with respect to an approximately whole region of the front surface of the semiconductor wafer 35.

In a case where a laser beam is incident onto the semiconductor wafer 35, the surface layer part at an incidence position is heated, and thus, the dopants are activated. Thermal radiation light is emitted from the heated portion. A part of the thermal radiation light emitted from the semiconductor wafer 35 is reflected from the dichroic mirror 25 to then be incident onto the infrared detector 20. The dichroic mirror 25 transmits light of a wavelength region shorter than 1 μm, and reflects light of a wavelength region longer than 1 μm, for example. On a path of thermal radiation light from the semiconductor wafer 35 to the infrared detector 20, a lens, an optical filter, or the like may be disposed, as necessary. In this embodiment, an optical filter is inserted so that thermal radiation light of a wavelength region of 2 μm to 2.8 μm is incident onto the infrared detector 20.

The infrared detector 20 has a sensitivity in an infrared wavelength region, and outputs a signal (voltage) having a size based on the intensity of incident thermal radiation light. The output signal (output voltage) of the infrared detector 20 is input to the processing device 40. The processing device 40 controls the laser light source 11 so that a pulse laser beam is output from the laser light source 11. Further, the processing device 40 controls the stage 31 so that the semiconductor wafer 35 is moved in a two-dimensional direction, to thereby repeat main scanning and subscanning.

The processing device 40 acquires a size (output value) of a signal output from the infrared detector 20 in synchronization with each shot of pulse laser beams. Further, the processing device 40 stores the acquired output value in the storage device 41 in association with an in-plane position of the semiconductor wafer 35. For example, for each shot of the pulse laser beams, a temporal waveform of the output value is obtained in accordance with a temporal change of the intensity of the thermal radiation light. The output value accumulated in the storage device 41 is a peak value of the temporal waveform or an integrated value of the temporal waveform for each shot of the pulse laser beams, for example.

A variety of commands for instructing operations of the laser annealing apparatus and data are input to the processing device 40 through the input device 43. The processing device 40 outputs a sheet resistance calculation result to the output device 42.

Figure 2:
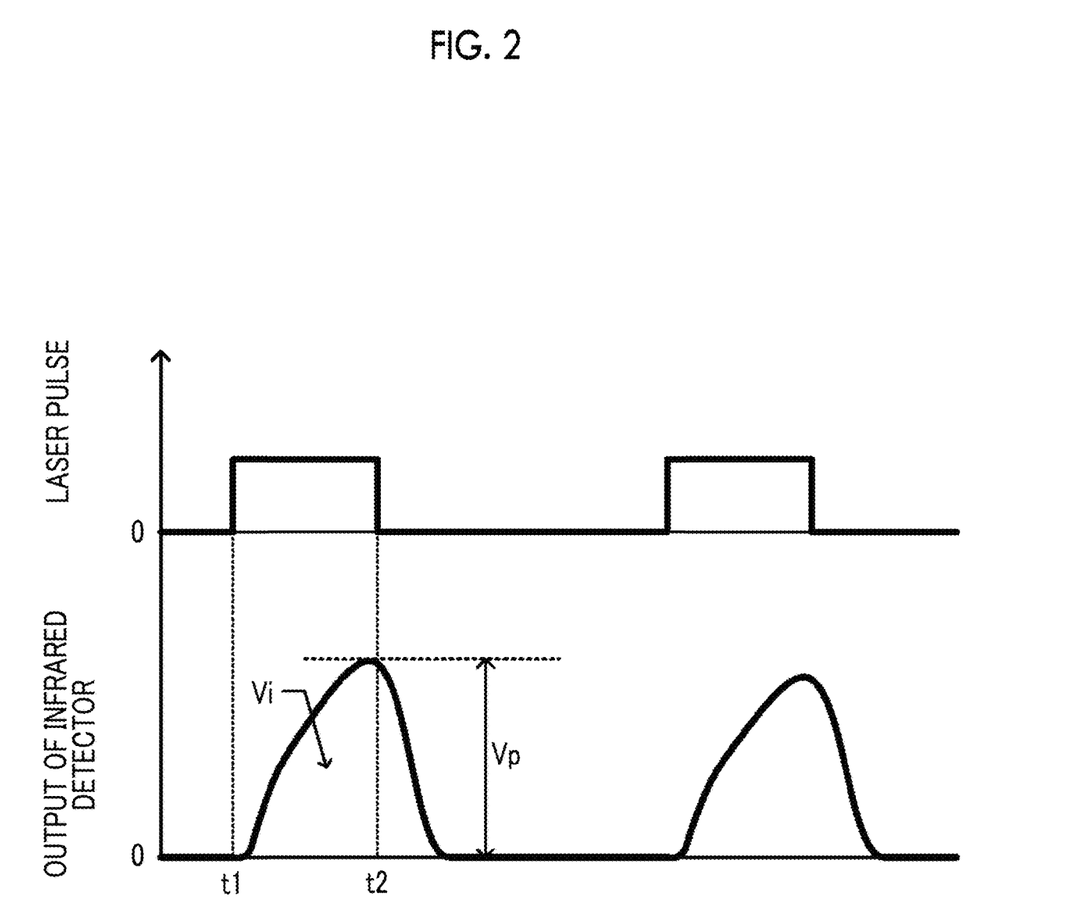
FIG. 2 is a graph showing an example of a schematic waveform of a pulse laser beam output from a laser light source and a waveform of an output value of an infrared detector.

FIG. 2 is a graph showing an example of a schematic waveform of a pulse laser beam output from the laser light source 11 and an output signal waveform of the infrared detector 20. In a case where a laser pulse rises at a time point t1, an output value of the infrared detector 20 gradually increases in accordance with a temperature increase of a surface layer part of the semiconductor wafer 35. In a case where the laser pulse falls at a time point t2, the output value of the infrared detector 20 gradually decreases in accordance with a temperature decrease of the surface layer part of the semiconductor wafer 35. An output peak value Vp of the output of the infrared detector 20 or an integrated value Vi of a temporal waveform based on the laser pulse from the time point t1 to the time point t2 is accumulated in the storage device 41.

Figure 3:
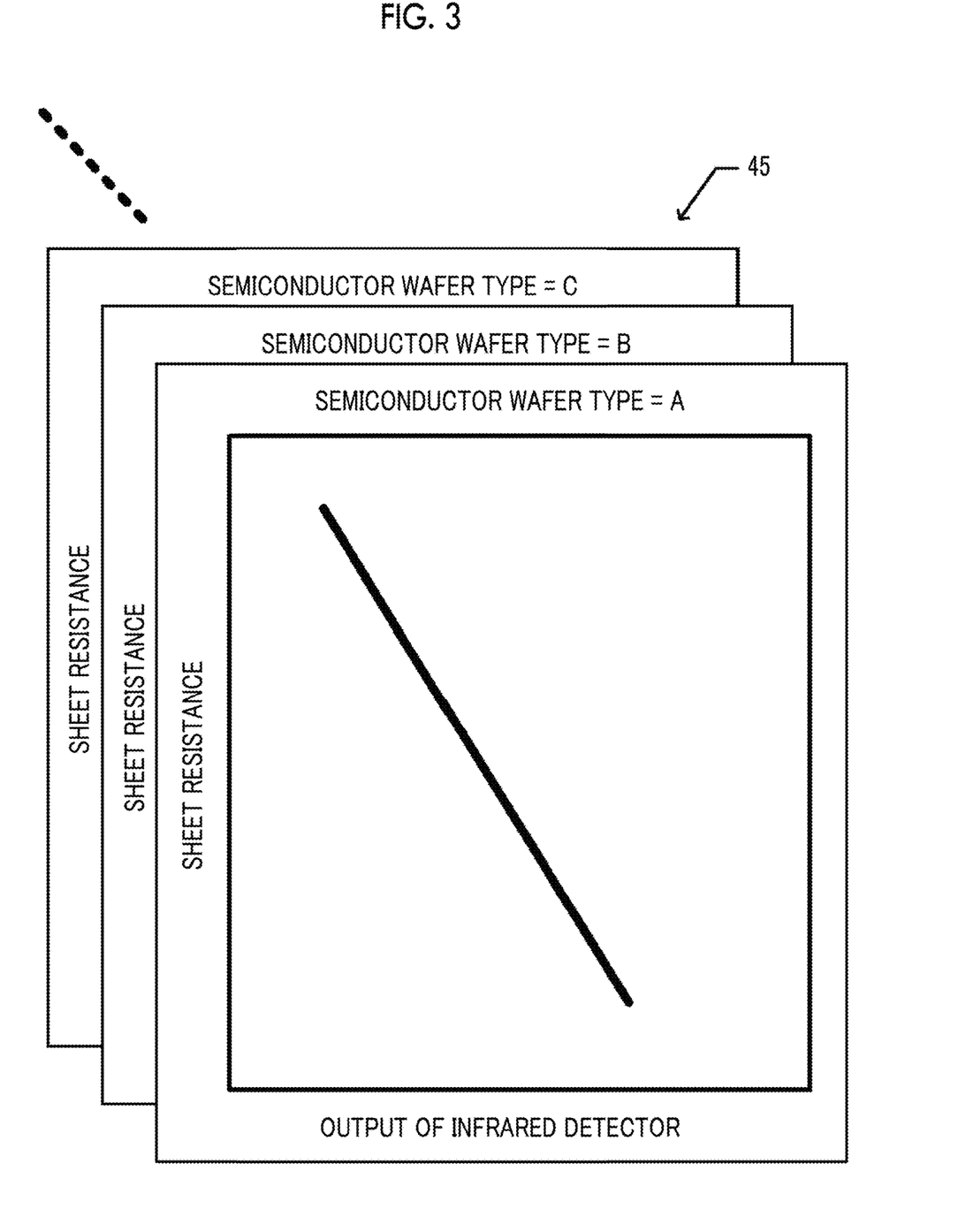
FIG. 3 is a schematic diagram of relational data indicating a relationship between an output of an infrared detector and a sheet resistance.

FIG. 3 is a schematic diagram showing relational data 45 indicating a relationship between an output of the infrared detector 20 and a sheet resistance in a graph form. The relational data 45 is prepared for each type of the semiconductor wafer 35. The processing device 40 (FIG. 1) calculates a sheet resistance from an output value of the infrared detector 20 using the relational data 45. For example, the intensity of thermal radiation light from the surface layer part of the semiconductor wafer 35 becomes large due to laser irradiation. That is, the intensity of thermal radiation light becomes larger as an annealing temperature becomes higher, and consequently, the output value of the infrared detector 20 becomes larger. Accordingly, as the output value of the infrared detector 20 becomes larger, the sheet resistance tends to become smaller.

Further, the sheet resistance depends on the type or concentration of dopants implanted to the semiconductor wafer 35, the thickness of the semiconductor wafer 35, or the like. Accordingly, the relational data 45 is prepared for each type (product type) of the semiconductor wafer 35. The relational data 45 may be obtained by laser-annealing an evaluation semiconductor wafer having the same structure as an actual product using laser beams having various fluencies and measuring a sheet resistance.

Figure 4:
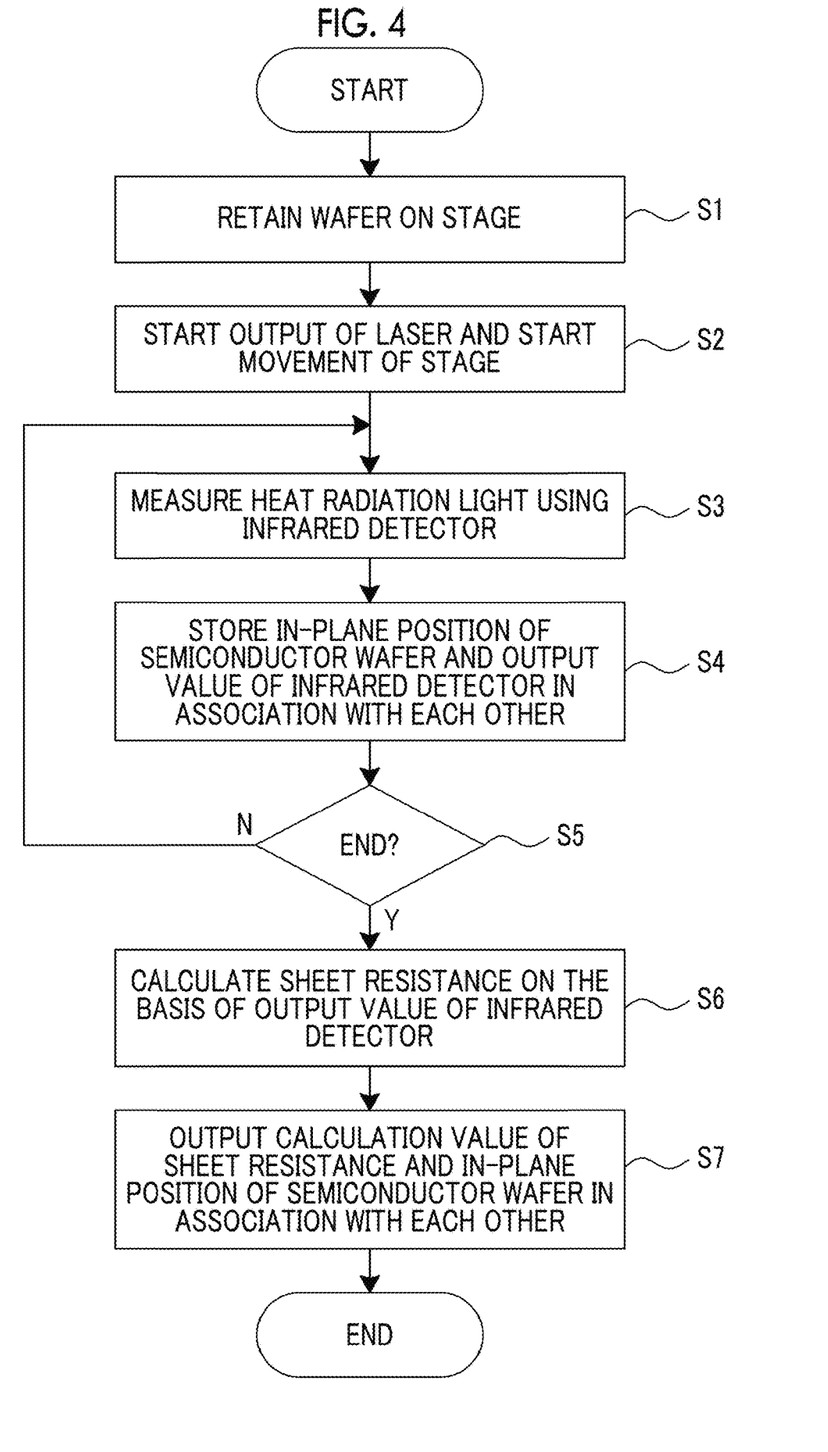
FIG. 4 is a flowchart showing a procedure for performing annealing of a semiconductor wafer using a laser annealing apparatus according to an embodiment.

FIG. 4 is a flowchart showing a procedure for performing laser annealing of the semiconductor wafer 35 using the laser annealing apparatus according to this embodiment.

First, the semiconductor wafer 35 (FIG. 1) in which dopants are ion-implanted is retained on the stage 31 (FIG. 1) (step S1). For example, this procedure is performed by a robot arm, or the like, for example. The stage 31 fixes the semiconductor wafer 35 using a vacuum chuck, for example. The type of the semiconductor wafer 35 that flows in a manufacturing line is stored in the storage device 41 in advance. The processing device 40 may acquire the type of the semiconductor wafer 35 by reading an identification mark or the like recorded on the semiconductor wafer 35.

After the semiconductor wafer 35 is retained on the stage 31, output of a pulse laser beam from the laser light source 11 and movement of the stage 31 are started (step S2). While the semiconductor wafer 35 is being scanned using the pulse laser beam, the intensity of thermal radiation light from the semiconductor wafer 35 is measured by the infrared detector 20 (step S3). For example, the processing device 40 acquires an output value of the infrared detector 20.

The processing device 40 stores an in-plane position of the semiconductor wafer 35 on which the laser beam is incident and the output value of the infrared detector 20 in the storage device 41 in association with each other (step S4). The processes of step S3 and step S4 are repeated until an approximately whole region of a front surface of the semiconductor wafer 35 is annealed (step S5).

In a case where the annealing of the approximately whole region of the front surface of the semiconductor wafer 35 is terminated, the processing device 40 calculates a sheet resistance of the semiconductor wafer 35 on the basis of the output value of the infrared detector 20 (step S6). For example, the processing device 4 may calculate the sheet resistance using the output value of the infrared detector 20 and the relational data shown in FIG. 3. Then, the processing device 40 outputs the calculation value of the sheet resistance to the output device 42 (FIG. 1) in association with the in-plane position of the semiconductor wafer 35. For example, a distribution of the in-plane sheet resistance of the semiconductor wafer 35 may be displayed as a figure.

Figure 5A:
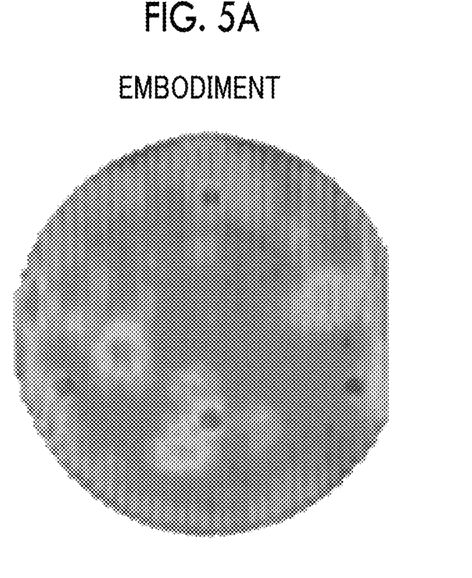
FIG. 5A is a diagram showing an in-plane distribution of a sheet resistance calculated by a method according to an embodiment.
Figure 5B:
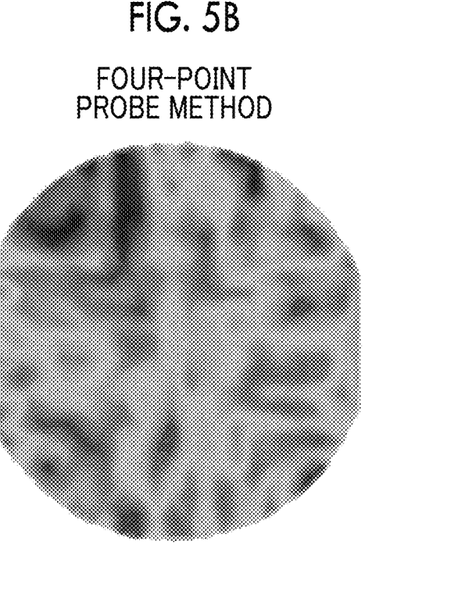
FIG. 5B is a diagram showing an in-plane distribution of a sheet resistance obtained by a four-point probe method in the related art.

FIG. 5A is a diagram showing an in-plane distribution of a sheet resistance calculated using the laser annealing apparatus according to this embodiment, and FIG. 5B is a diagram showing an in-plane distribution of the sheet resistance calculated by the four-point probe method in the related art with respect to the same sample as in FIG. 5A. In FIGS. 5A and 5B, sizes of sheet resistances are indicated by shades of gray. In a measurement result shown in FIG. 5A, a striped pattern parallel to a main scanning direction of a pulse laser beam is shown. Focusing on one band-like region of the striped pattern, there is a tendency that a sheet resistance on an upper stream side in a scanning direction is higher than a sheet resistance on a downstream side. A cycle of stripes in the striped pattern corresponds to a moving distance in one-time sub-scanning of the pulse laser beam. In the four-point probe method, sheet resistances at 121 points in a plane of the semiconductor wafer 35 are measured.

Figure 5C:
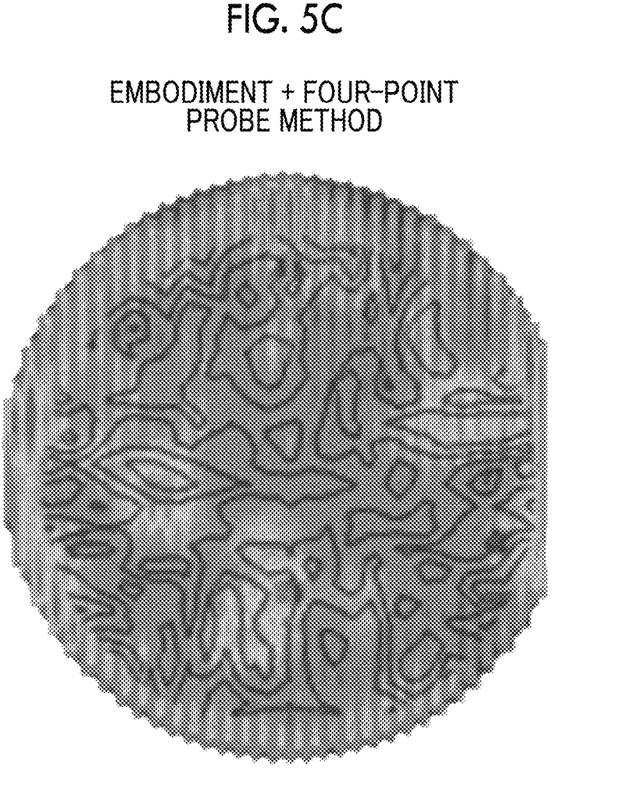
FIG. 5C is a diagram showing the distribution of the sheet resistance shown in FIG. 5A and a contour line of the sheet resistance obtained by measurement using the four-point probe method in an overlapping manner.

FIG. 5C is a diagram the distribution of the sheet resistances shown in FIG. 5A and an isopleth of the sheet resistance obtained by measurement using the four-point probe method in an overlapping manner. It can be understood that there is a relationship between the distribution of the sheet resistances obtained by the method according to this embodiment and the distribution of the sheet resistances measured by the four-point probe method. Consequently, it can be understood that the method for calculating the sheet resistances using the laser annealing apparatus according to this embodiment may be employed as an alternative of the method for measuring the sheet resistances using the four-point probe method.

Next, excellent effects of the laser annealing apparatus according to this embodiment will be described.

In the laser annealing apparatus according to this embodiment, basic information (output value of the infrared detector 20) for calculating a sheet resistance is acquired during laser annealing. Thus, it is possible to obtain a sheet resistance without measuring the sheet resistance in an off-line manner after laser annealing.

Further, using the laser annealing apparatus according to this embodiment, it is possible to calculate a sheet resistance without causing the semiconductor wafer 35 to be in contact with a probe or the like. Thus, it is possible to calculate a sheet resistance without damaging the semiconductor wafer 35 due to the contact with the probe or the like.

A spatial resolution in a case where a sheet resistance is measured by the four-point probe method depends on an inter-probe distance. For example, a distance between probes at opposite ends is about 3 mm. It is difficult to obtain a sheet resistance by a spatial resolution higher than the distance between the probes. On the other hand, in the method according to this embodiment, it is possible to make a spatial resolution high to the extent of the size of a beam spot of a laser beam.

The sheet resistance capable of being measured by the four-point probe method is a sheet resistance in a very shallow surface layer part having a depth of about 0.1 μm from a front surface of the semiconductor wafer 35. On the other hand, in this embodiment, thermal radiation light emitted from a region having a deeper depth, for example, a region having a depth of 2 to 3 μm may also pass through the semiconductor wafer 35 to be detected by the infrared detector 20. Thus, it is possible to estimate a sheet resistance in consideration of the depth of 2 to 3 μm in the method according to this embodiment.

Next, various modification examples of this embodiment will be described. In the above-described embodiment, a configuration in which silicon is used as the semiconductor wafer 35 is shown, but a configuration in which a wafer is formed of a different semiconductor material may be used. Further, in the above-described embodiment, a configuration in which the relational data 45 (FIG. 3) indicating the relationship between the output of the infrared detector 20 and the sheet resistance is prepared for each type of the semiconductor wafer 35 is shown. Instead, a configuration in which the relational data 45 is prepared for each of various parameters such as a material of the semiconductor wafer 35, a thickness thereof, a type of dopants, a dose, or an implantation depth may be used.

In the above-described embodiment, the laser annealing apparatus having a function for calculating a sheet resistance has been described. A configuration in which functions relating to sheet resistance calculation, of the processing device 40, the storage device 41 and the output device 42, and the infrared detector 20 are extracted from the laser annealing apparatus according to this embodiment to realize those components as a sheet resistance calculation apparatus may be provided.

The above-described embodiment is only an example, and thus, that partial replacement or combination of the components shown in this embodiment is possible. Further, the invention is not limited to the above-described embodiment. For example, it will be obvious to those skilled in the art that a variety of modifications, improvements, combinations, or the like are possible.

It should be understood that the invention is not limited to the above-described embodiment, but may be modified into various forms on the basis of the spirit of the invention. Additionally, the modifications are included in the scope of the invention.

What is claimed is:

1. A laser annealing apparatus comprising:
    a stage on which a semiconductor wafer is retained;
    a laser optical system that causes a laser beam to be incident onto the semiconductor wafer retained on the stage;
    an infrared detector onto which thermal radiation light from the semiconductor wafer retained on the stage is incident, and which outputs a signal based on the intensity of the thermal radiation light;
    a processing device that calculates a sheet resistance of the semiconductor wafer that is annealed by the laser beam on the basis of an output value of the infrared detector and outputs a calculation value of the sheet resistance to an output device; and
    a storage device that stores relational data indicating a relationship between the output value of the infrared detector and the sheet resistance for each type of the semiconductor wafer that is an annealing target,
    wherein the processing device calculates the sheet resistance using the relational data according to the type of the semiconductor wafer retained on the stage.

2. The laser annealing apparatus according to claim 1,
    wherein thermal radiation light from a position of the semiconductor wafer onto which the laser beam is incident is incident onto the infrared detector, and
    wherein the processing device outputs the calculation value of the sheet resistance to the output device in association with an in-plane position of the semiconductor wafer in which thermal radiation light is emitted.

3. The laser annealing apparatus according to claim 1,
    wherein at least one of phosphorous, arsenic, or boron, as dopants, is implanted into a surface layer part of the semiconductor wafer by an ion implantation method.

4. A sheet resistance calculation apparatus comprising:
    an infrared detector onto which thermal radiation light from a semiconductor wafer that is an annealing target is incident, and which outputs a signal based on the intensity of the thermal radiation light; and a processing device to which an output value of the infrared detector is input, and which calculates a sheet resistance of the semiconductor wafer on the basis of the output value and outputs a calculation value of the sheet resistance; and a storage device that stores relational data indicating a relationship between the output value of the infrared detector and the sheet resistance for each type of the semiconductor wafer that is the annealing target, wherein the processing device calculates the sheet resistance using the relational data according to the type of the semiconductor wafer in which the thermal radiation light is detected.

5. A laser annealing apparatus comprising:

a laser optical system that causes a laser beam to be incident onto a semiconductor wafer;

an infrared detector onto which thermal radiation light of a wavelength region longer than 1 μm from the semiconductor wafer is incident, and which outputs a signal based on the intensity of the thermal radiation light; and a processing device that calculates a sheet resistance of the semiconductor wafer that is annealed by the laser beam on the basis of an output value of the infrared detector and outputs a calculation value of the sheet resistance to an output device, wherein the laser optical system comprises a laser diode having an oscillation wavelength of 808 nm.

6. The laser annealing apparatus according to claim 5, wherein thermal radiation light from a position of the semiconductor wafer onto which the laser beam is incident is incident onto the infrared detector, and wherein the processing device outputs the calculation value of the sheet resistance to the output device in association with an in-plane position of the semiconductor wafer in which thermal radiation light is emitted.

7. The laser annealing apparatus according to claim 5, further comprising:

a storage device that stores relational data indicating a relationship between the output value of the infrared detector and the sheet resistance for each type of the semiconductor wafer that is an annealing target, wherein the processing device calculates the sheet resistance using the relational data according to the type of the semiconductor wafer.

8. The laser annealing apparatus according to claim 5, wherein at least one of phosphorous, arsenic, or boron, as dopants, is implanted into a surface layer part of the semiconductor wafer by an ion implantation method.

* * * * *